United States Patent
Ko et al.

(10) Patent No.: US 8,847,210 B2
(45) Date of Patent: Sep. 30, 2014

(54) ORGANIC LIGHT EMITTING DIODE DISPLAY

(75) Inventors: Hee-Joo Ko, Yongin (KR); Se-Jin Cho, Yongin (KR); Chang-Ho Lee, Yongin (KR); Il-Soo Oh, Yongin (KR); Hyung-Jun Song, Yongin (KR); Jin-Young Yun, Yongin (KR); Bo-Ra Lee, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 23 days.

(21) Appl. No.: 13/237,877

(22) Filed: Sep. 20, 2011

(65) Prior Publication Data

US 2012/0319147 A1 Dec. 20, 2012

(30) Foreign Application Priority Data

Jun. 14, 2011 (KR) ........................ 10-2011-0057672

(51) Int. Cl.
  *H01L 51/50* (2006.01)
  *H01L 51/52* (2006.01)
  *H01L 27/32* (2006.01)

(52) U.S. Cl.
  CPC .......... *H01L 27/3206* (2013.01); *H01L 27/322* (2013.01); *H01L 27/3244* (2013.01); *H01L 51/5265* (2013.01); *H01L 27/3209* (2013.01)
  USPC .......... 257/40; 257/88; 257/89; 257/E51.021; 257/E51.022; 438/34; 438/35

(58) Field of Classification Search
  CPC . H01L 27/3211; H01L 27/322; H01L 51/504; H01L 51/5265; H01L 51/5278
  USPC .................... 257/89, 88, 40, 90, 98, E51.001, 257/E51.018, E51.021, E51.022; 438/22, 438/25, 26, 28, 29, 34, 35, 99
  See application file for complete search history.

(56) References Cited

U.S. PATENT DOCUMENTS

| | | | | |
|---|---|---|---|---|
| 6,117,529 | A * | 9/2000 | Leising et al. | 428/209 |
| 7,247,394 | B2 * | 7/2007 | Hatwar et al. | 428/690 |
| 7,339,315 | B2 * | 3/2008 | Suh et al. | 313/501 |
| 7,531,856 | B2 * | 5/2009 | Kobori | 257/290 |
| 7,863,808 | B2 * | 1/2011 | Terao | 313/501 |
| 8,053,770 | B2 * | 11/2011 | D'Andrade et al. | 257/40 |
| 8,288,784 | B2 * | 10/2012 | Cho | 257/89 |
| 8,471,275 | B2 * | 6/2013 | Lee et al. | 257/89 |
| 2005/0249972 | A1 * | 11/2005 | Hatwar et al. | 428/690 |

(Continued)

FOREIGN PATENT DOCUMENTS

| | | |
|---|---|---|
| JP | 10-177896 | 6/1998 |
| KR | 1020070043014 A | 4/2007 |

(Continued)

*Primary Examiner* — Fernando L Toledo
*Assistant Examiner* — Christine C Lau
(74) *Attorney, Agent, or Firm* — Christie, Parker & Hale, LLP

(57) ABSTRACT

An organic light emitting diode (OLED) display includes: a substrate; a first electrode on the substrate; a first emission layer on the first electrode; a second emission layer on the first emission layer; a second electrode on the second emission layer; and a light emitting assistance layer selectively positioned between the first emission layer and the second emission layer.

14 Claims, 8 Drawing Sheets

(56) References Cited

U.S. PATENT DOCUMENTS

| | | | |
|---|---|---|---|
| 2005/0280355 A1* | 12/2005 | Lee et al. | 313/503 |
| 2006/0097264 A1* | 5/2006 | Kim et al. | 257/72 |
| 2006/0186793 A1* | 8/2006 | Iou | 313/503 |
| 2007/0114922 A1* | 5/2007 | Sung et al. | 313/506 |
| 2007/0120453 A1* | 5/2007 | Hwang et al. | 313/112 |
| 2008/0054797 A1* | 3/2008 | Furugori | 313/504 |
| 2008/0116790 A1* | 5/2008 | Kho et al. | 313/504 |
| 2008/0278066 A1* | 11/2008 | Spindler et al. | 313/504 |
| 2009/0278450 A1* | 11/2009 | Sonoyama et al. | 313/504 |
| 2009/0315458 A1* | 12/2009 | Choi et al. | 313/505 |
| 2010/0156280 A1* | 6/2010 | Song et al. | 313/504 |
| 2010/0219429 A1* | 9/2010 | Cok et al. | 257/89 |
| 2011/0042697 A1* | 2/2011 | Lee et al. | 257/89 |
| 2011/0114974 A1* | 5/2011 | Song et al. | 257/89 |
| 2011/0168988 A1* | 7/2011 | Jeong et al. | 257/40 |
| 2011/0233528 A1* | 9/2011 | Levermore et al. | 257/40 |
| 2012/0018749 A1* | 1/2012 | Lee et al. | 257/89 |
| 2013/0048986 A1* | 2/2013 | Lee et al. | 257/52 |
| 2013/0146903 A1* | 6/2013 | Ichikawa et al. | 257/88 |

FOREIGN PATENT DOCUMENTS

| | | |
|---|---|---|
| KR | 100721953 B1 | 5/2007 |
| KR | 1020080020509 A | 3/2008 |
| KR | 1020100018503 A | 2/2010 |

* cited by examiner

ORGANIC LIGHT EMITTING DIODE DISPLAY

CROSS-REFERENCE TO RELATED APPLICATIONS

This application claims priority to and the benefit of Korean Patent Application No. 10-2011-0057672 filed in the Korean Intellectual Property Office on Jun. 14, 2011, the entire content of which is incorporated herein by reference.

BACKGROUND

1. Field

The described technology relates generally to an organic light emitting diode (OLED) display.

2. Description of the Related Art

Display devices display images, and recently, an organic light emitting diode display has been in the spotlight.

The organic light emitting diode display has a self-emitting characteristic and does not need a separate light source unlike a liquid crystal display, such that the thickness and weight thereof may be decreased. In addition, the organic light emitting diode display has high quality characteristics such as low power consumption, high luminance, high reaction speed, and the like.

A conventional organic light emitting diode (OLED) display includes an organic light emitting element having a first electrode, a second electrode, and an organic emission layer positioned between the first electrode and the second electrode, and the organic light emitting element emits light of various colors according to the kind of materials forming the organic emission layer.

Recently, an organic light emitting element emitting white light has been developed by depositing three emission layers emitting red, green, and blue light.

The conventional organic light emitting element emitting white light is formed by depositing three emission layers such that a separate mask to deposit each emission layer is used, and thereby the manufacturing cost is not only increased but also the manufacturing time of the organic light emitting diode (OLED) display is increased due to a complicated process.

Also, the conventional organic light emitting element that emits white light is formed by depositing three emission layers such that the entire thickness of the organic emission layer is increased. Accordingly, a driving voltage to obtain the same current and the same luminance is increased by about two times to five times compared with a structure in which only one emission layer is deposited such that the power consumption to drive the organic light emitting diode (OLED) display is quickly increased, and thereby the driving efficiency is deteriorated.

The above information disclosed in this Background section is only for enhancement of understanding of the background of the described technology and therefore it may contain information that does not form the prior art that is already known in this country to a person of ordinary skill in the art.

SUMMARY

An exemplary embodiment of the present invention provides an organic light emitting diode (OLED) display that is produced with reduced manufacturing time and manufacturing cost.

Also, an organic light emitting diode (OLED) display with improved driving efficiency is provided.

An organic light emitting diode (OLED) display according to embodiments of the present invention includes: a substrate; a first electrode on the substrate; a first emission layer on the first electrode; a second emission layer on the first emission layer; a second electrode on the second emission layer; and a light emitting assistance layer selectively positioned between the first emission layer and the second emission layer.

Light emitted from the first emission layer may be visible in a first region where the light emitting assistance layer is positioned.

Light emitted from the second emission layer may be visible in a second region neighboring to the first region.

A color transformation matrix positioned in a third region neighboring the second region and configured to convert the wavelength of the light emitted from the first emission layer and the second emission layer may be further included.

The second emission layer may emit blue light.

The first emission layer may emit red light.

The color transformation matrix may convert the light from the first emission layer and the second emission layer into green light.

The first emission layer may emit green light.

The color transformation matrix may convert the light emitted from the first emission layer and the second emission layer into red light.

The first emission layer may emit blue light.

The second emission layer may emit red light.

The second emission layer may emit green light.

The first electrode may be reflective and the second electrode may be light semi-transmissive.

The first electrode may be an anode, the second electrode may be a cathode, and the second emission layer may have a higher electron transferring capability than the first emission layer.

At least one of an electron injection layer (EIL), an electron transport layer (ETL), a hole injection layer (HIL), or a hole transport layer (HTL) positioned between the first electrode and the second electrode may be further included, and the light emitting assistance layer may include the same material as at least one of the electron injection layer (EIL), the electron transport layer (ETL), the hole injection layer (HIL), or the hole transport layer (HTL).

According to the above described exemplary embodiment, an organic light emitting diode (OLED) display that is produced with reduced manufacturing time and manufacturing cost is provided.

Also, an organic light emitting diode (OLED) display with improved driving efficiency is provided.

DETAILED DESCRIPTION

Figure 1:
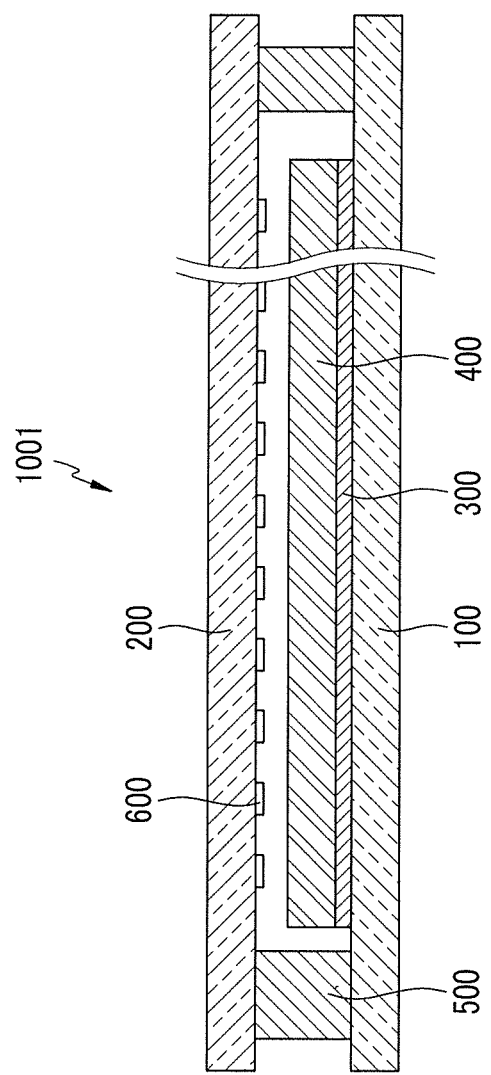
FIG. 1 is a cross-sectional view of an organic light emitting diode (OLED) display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, "~on" is either positioned on or below a portion of a target or positioned on the upper side based on a gravity direction, throughout the specification.

Further, in the accompanying drawings, although an active matrix (AM) type of organic light emitting diode display having a 2Tr-1Cap structure is shown, which is provided with two thin film transistors (TFTs) and one storage capacitor in one pixel, exemplary embodiments are not limited thereto. Accordingly, the organic light emitting diode display may be provided with three or more thin film transistors and two or more storage capacitors in one pixel and may be configured to have various structures with additional wires. Herein, the pixel represents a minimum unit (i.e., a smallest unit) for displaying an image, and the organic light emitting diode display displays the image using a plurality of pixels.

Hereinafter, referring to FIG. 1 to FIG. 4, an organic light emitting diode display according to a first exemplary embodiment will be described.

FIG. 1 is a cross-sectional view of an organic light emitting diode (OLED) display according to the first exemplary embodiment.

As shown in FIG. 1, an organic light emitting diode (OLED) display 1001 according to the first exemplary embodiment includes a first substrate 100, a second substrate 200, a wire part 300, an organic light emitting element 400, a sealant 500, and a color transformation matrix 600.

The first substrate 100 and the second substrate 200 may be insulating substrates including glass, a polymer, or stainless steel, and the second substrate 200 may be made of a light transmissive material. The wiring part 300 and the organic light emitting element 400 are positioned on the first substrate 100, and the second substrate 200 faces the first substrate 100 with the wiring part 300 and the organic light emitting element 400 interposed therebetween. The first substrate 100 and the second substrate 200 are attached and sealed to each other by the sealant 500 with the organic light emitting element 400 interposed therebetween. The first substrate 100 and the second substrate 200 protect the wiring part 300 and the organic light emitting element 400 from external interference.

The wiring part 300 includes first and second thin film transistors 10 and 20 (shown in FIG. 2), and drives the organic light emitting element 400 by transferring a signal to the organic light emitting element 400. The organic light emitting element 400 emits light depending on the signal received from the wiring part 300.

The organic light emitting element 400 is positioned on the wiring part 300.

The organic light emitting element 400 is positioned on the first substrate 100, and receives the signal from the wiring part 300 to display an image by using the received signal.

The color transformation matrix 600 converts a wavelength of the light emitted from the organic light emitting element 400 such that the light emitted from the organic light emitting element 400 is converted. In FIG. 1, the color transformation matrix 600 of the organic light emitting diode (OLED) display 1001 according to the first exemplary embodiment is positioned between the second substrate 200 and the organic light emitting element 400, however, the color transformation matrix of the organic light emitting diode (OLED) display according to another exemplary embodiment may be positioned at at least one of regions on the second substrate 200, inside the second substrate 200, or inside the organic light emitting element 400. That is, the color transformation matrix 600 may be positioned at any path of the light emitted from the organic light emitting element 400.

Hereinafter, referring to FIGS. 2 and 3, the internal structure of the organic light emitting diode display according to the first exemplary embodiment will be described in detail.

Figure 2:
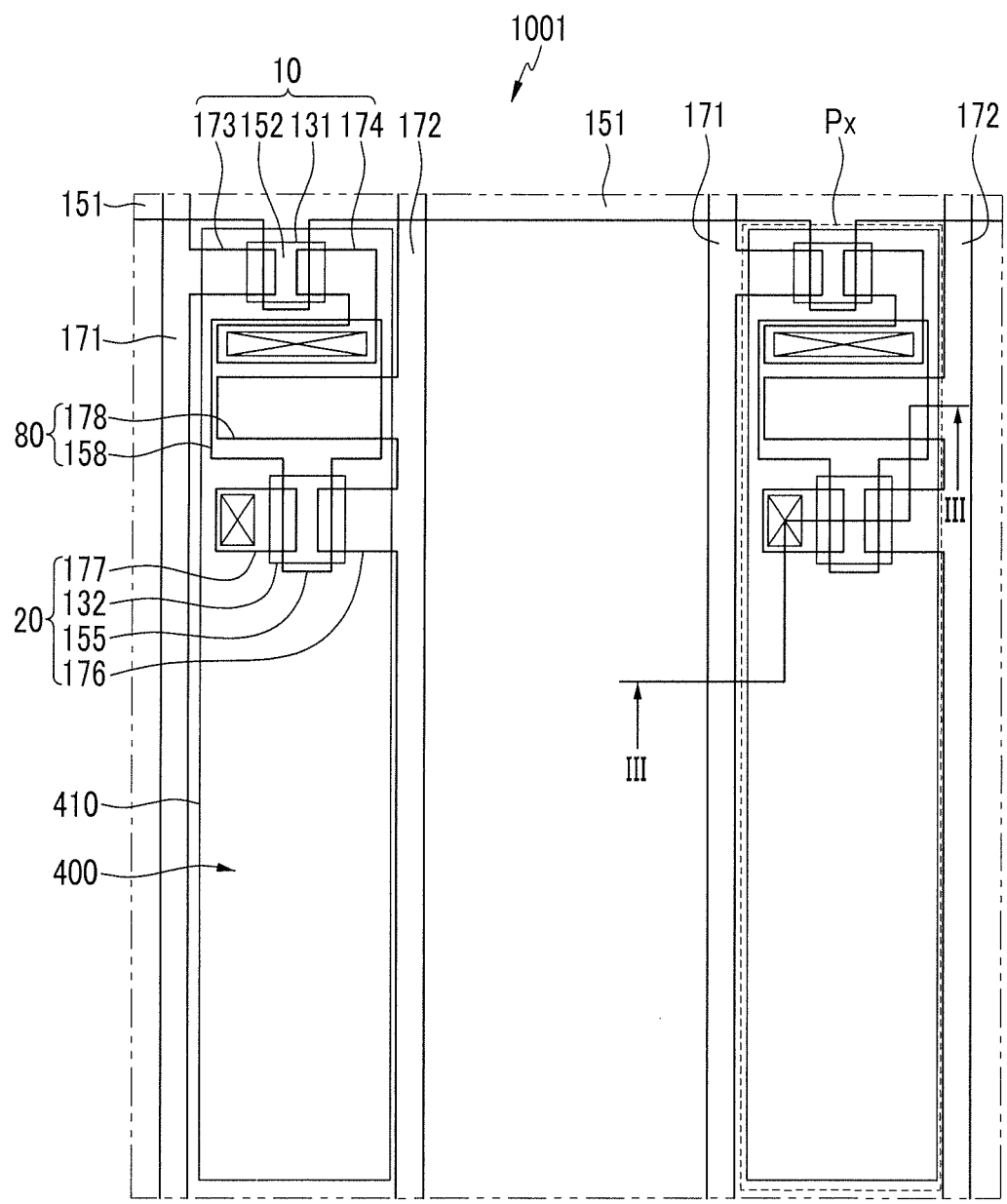
FIG. 2 is a layout view of a pixel of an organic light emitting diode (OLED) display according to the first exemplary embodiment.

FIG. 2 is a layout view illustrating the structure of a pixel of the organic light emitting diode display according to the first exemplary embodiment. FIG. 3 is a cross-sectional view taken along the line III-III of FIG. 2.

Figure 3:
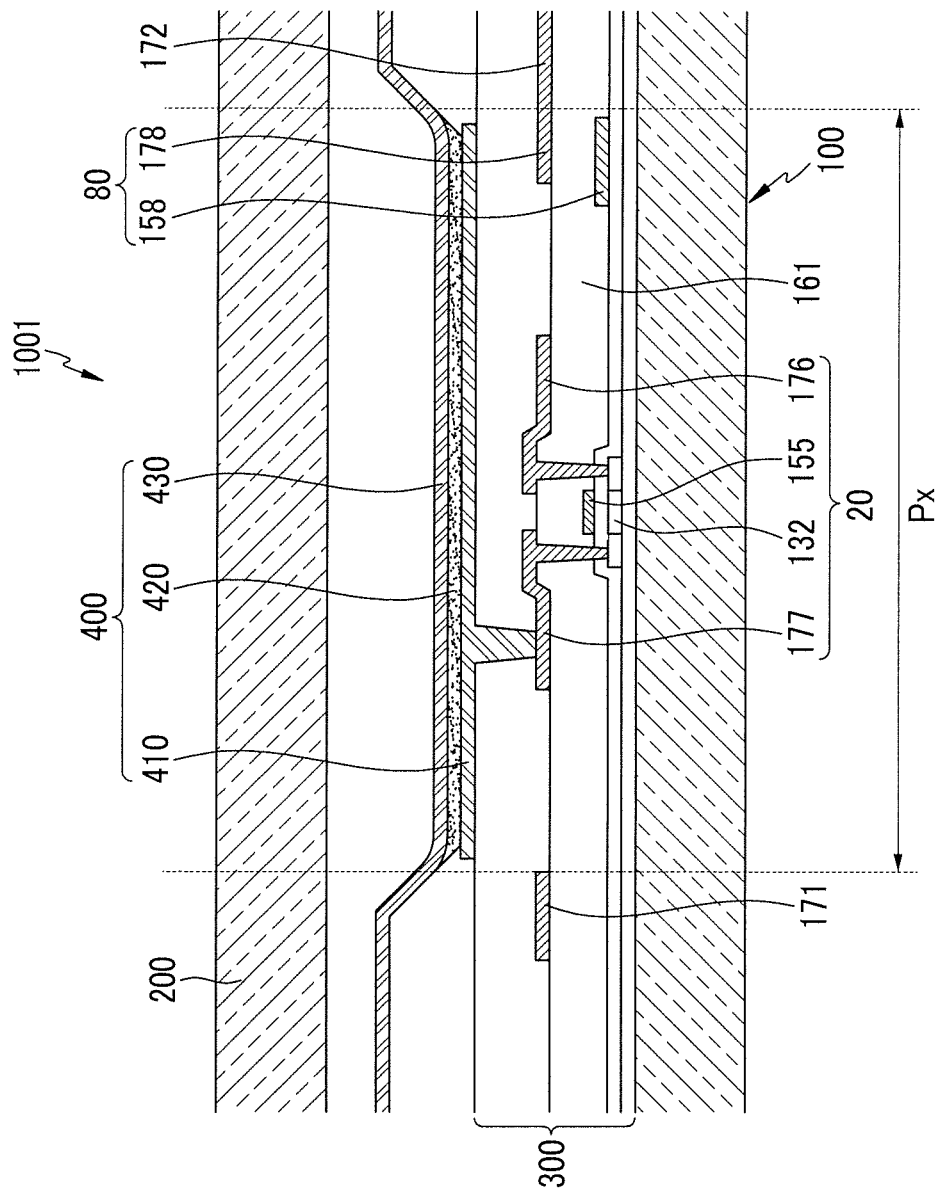
FIG. 3 is a cross-sectional view taken along the line III-III of FIG. 2.

Hereinafter, the detailed structures of the wiring part 300 and the organic light emitting element 400 are shown in FIGS. 2 and 3, but the present invention is not limited to the structures shown in FIGS. 2 and 3. The wiring part 300 and the organic light emitting element 400 may be formed in various structures within the scope that can be easily modified by those skilled in the art. For example, in the accompanying drawings, although an active matrix (AM) type of organic light emitting diode display having a 2Tr-1Cap structure is shown, which is provided with two thin film transistors (TFTs) and one storage capacitor in one pixel, the present invention is not limited thereto. Therefore, in the case of the organic light emitting diode display, the number of thin film transistors, the number of storage capacitors, and the number of wires are not limited.

Meanwhile, the pixel represents the minimum unit (e.g., the smallest unit) for displaying an image, and the organic light emitting diode display displays the image through a plurality of pixels.

Also, FIG. 2 and FIG. 3 are views representing one pixel Px that emits blue light among a plurality of pixels included in the organic light emitting diode (OLED) display 1001 according to the first exemplary embodiment.

As shown in FIG. 2 and FIG. 3, the organic light emitting diode display includes a switching thin film transistor 10, a driving thin film transistor 20, a storage capacitor 80, and an organic light emitting element 400 formed in each pixel. Herein, a configuration including the switching thin film transistor 10, the driving thin film transistor 20, and the storage capacitor 80 may be referred to as the wiring part 300. In addition, the wiring part 300 further includes a gate line 151 disposed in one direction of the first substrate 100, and a data line 171 and a common power supply line 172 insulatively crossing the gate line 151. Herein, a boundary of one pixel may be defined by the gate line 151, the data line 171, and the common power supply line 172, but is not limited thereto.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element that selects a desired pixel to emit light. The switching gate electrode 152 is coupled to the gate line 151. The switching source electrode 173 is coupled to the data line 171. The switching drain electrode 174 is spaced apart from the switching source electrode 173 and coupled to a storage plate (e.g., a second storage plate 158) of the storage capacitor 80.

The driving thin film transistor 20 applies driving power for allowing the organic emission layer 420 of the organic light emitting element 400 in the selected pixel to emit light, to the first electrode 410. The driving gate electrode 155 is coupled to the storage plate 158 that is coupled with the switching drain electrode 174. Each of the driving source electrode 176 and a second storage plate 178 is coupled to the common power supply line 172. The driving drain electrode 177 is coupled to the first electrode 410 of the organic light emitting element 400 through a contact hole.

The storage capacitor 80 includes a pair of storage plates 158 and 178 that are arranged with an interlayer insulating layer 161 interposed therebetween. Herein, the interlayer insulating layer 161 is a dielectric, and the storage capacity of the storage capacitor 80 is determined by electric charges stored in the storage capacitor 80 and a voltage between the storage plates 158 and 178.

By this structure, the switching thin film transistor 10 is operated by a gate voltage applied to the gate line 151 to transfer a data voltage applied to the data line 171 to the driving thin film transistor 20. A voltage equivalent to a difference between a common voltage applied to the driving thin film transistor 20 from the common power supply line 172 and a data voltage transmitted from the switching thin film transistor 10 is stored in the storage capacitor 80, and a current corresponding to the voltage stored in the storage capacitor 80 flows to the organic light emitting element 400 through the driving thin film transistor 20 to allow the organic light emitting element 400 to emit light.

The organic light emitting element 400 includes a first electrode 410, an organic emission layer 420 positioned on the first electrode 410, and a second electrode 430 positioned on the organic emission layer 420.

Figure 4:
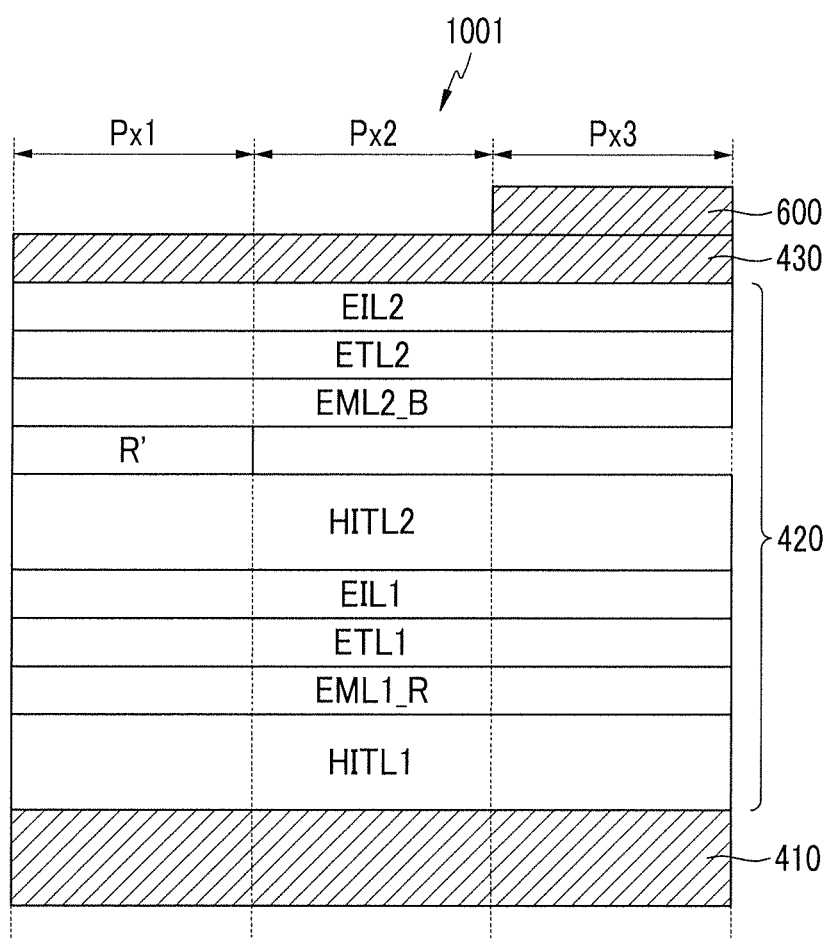
FIG. 4 is a schematic cross-sectional view of elements of an organic light emitting diode (OLED) display according to the first exemplary embodiment.

FIG. 4 is a schematic cross-sectional view of components (or elements) in the organic light emitting diode display according to the first exemplary embodiment. For better understanding and ease of description, FIG. 4 only shows constituent elements forming the neighboring pixels in the organic light emitting diode (OLED) display according to the first exemplary embodiment. Also, the first pixel, the second pixel, and the third pixel respectively correspond to the first region, the second region, and the third region.

As shown in FIG. 4, the organic light emitting diode (OLED) display 1001 according to the first exemplary embodiment includes a first pixel Px1, a second pixel Px2, and a third pixel Px3 that have similar structure as one pixel Px described in FIG. 2 and FIG. 3, wherein the first pixel Px1, the second pixel Px2, and the third pixel Px3 respectively include the organic light emitting element 400 including the first electrode 410, the organic emission layer 420, and the second electrode 430. The first pixel Px1 emits red light, the second pixel Px2 emits blue light, and the third pixel Px3 emits green light. The first pixel Px1, the second pixel Px2, and the third pixel Px3 may be separated from each other and may neighbor (e.g., be adjacent) each other.

The first electrode 410 of the first pixel Px1, the second pixel Px2, and the third pixel Px3 may be an anode as a hole injection electrode, and the second electrode 430 may be a cathode as an electron injection electrode. However, the first exemplary embodiment is not restricted thereto, and the first electrode 410 can become a cathode and the second electrode 430 can become an anode depending on the method for driving the organic light emitting diode (OLED) display. Holes and electrons are respectively injected into the organic emission layer 420 from the first electrode 410 and the second electrode 430, and the organic emission layer 420 emits light when excitons generated by combination of the holes and the electrons that are injected into the organic emission layer 420 enter the ground state from the excitation state. Also, the first electrode 410 may include a first sub-electrode including a light reflective conducting material of a single layer or a plurality of layers including at least one of aluminum (Al) or silver (Ag), and a second sub-electrode positioned on the first sub-electrode and including a conducting material having a high work function such as indium tin oxide (ITO). The second electrode 430 faces the first electrode 410 with the organic emission layer 420 interposed therebetween, and includes a semi-transmissive conducting material of a single layer or a plurality of layers including at least one of aluminum (Al), silver (Ag), calcium (Ca), calcium silver (CaAg), magnesium silver (MgAg), or aluminum silver (AlAg).

Each organic emission layer 420 of the first pixel Px1, the second pixel Px2, and the third pixel Px3 includes a first hole injection transport layer HITL1, a first emission layer EML1_R, a first electron transport layer (ETL) ETL1, a first electron injection layer (EIL) EIL1, a second hole injection transport layer HITL2, a second emission layer EML2_B, a second electron transport layer (ETL) ETL2, and a second electron injection layer (EIL) EIL2, the organic emission layer 420 of the first pixel Px1 from among the first pixel Px1, the second pixel Px2, and the third pixel Px3 further includes a light emitting assistance layer R'. A color transformation matrix 600 is positioned in the third pixel Px3 on the second electrode 430.

The first hole injection transport layer HITL1 is positioned on the first electrode 410, and assists the holes generated from the first electrode 410 to be smoothly injected and transported to the first emission layer EML1_R.

The first emission layer EML1_R is positioned between the first hole injection transport layer HITL1 and the first electron transport layer (ETL) ETL1, and the holes generated from the first electrode 410 and the electrons generated from the second electrode 430 are combined, thereby emitting red light.

The first electron transport layer (ETL) ETL1 is positioned on the first emission layer EML1_R, and assists the electrons generated from the second electrode 430 and passing through the second electron injection layer (EIL) EIL2, the second electron transport layer (ETL) ETL2, the second emission layer EML2_B, the second hole injection transport layer HITL2, and the first electron injection layer (EIL) EIL1 to be smoothly transported to the first emission layer EML1_R.

The first electron injection layer (EIL) EIL1 is positioned on the first electron transport layer (ETL) ETL1, and assists the electrons generated from the second electrode 430 and passing through the second electron injection layer (EIL) EIL2, the second electron transport layer (ETL) ETL2, the second emission layer EML2_B, and the second hole injection transport layer HITL2 to be smoothly injected to the first emission layer EML1_R.

The second hole injection transport layer HITL2 is positioned on the first electron injection layer (EIL) EIL1, and assists the holes generated from the first electrode 410 and passing through the first hole injection transport layer HITL1, the first emission layer EML1_R, and the first electron injection layer (EIL) EIL1 to be smoothly injected and transported to the second emission layer EML2_B.

The second emission layer EML2_B is positioned between the second hole injection transport layer HITL2 and the second electron transport layer (ETL) ETL2 and the holes generated from the first electrode 410 and the electrons generated from the second electrode 430 are combined, thereby emitting blue light.

The second electron transport layer (ETL) ETL2 is positioned on the second emission layer EML2_B, and assists the electrons generated from the second electrode 430 and passing through the second electron injection layer (EIL) EIL2 to be smoothly transported to the second emission layer EML2_B.

The second electron injection layer (EIL) EIL2 is positioned on the second electron transport layer (ETL) ETL2, and assists the electron generated from the second electrode 430 to be smoothly injected to the second emission layer EML2_B.

The light emitting assistance layer R' is positioned only in the first pixel Px1, which corresponds to the first region and has a function of increasing the thickness of the organic emission layer 420 of the first pixel Px1. The light emitting assistance layer R' may include the same material as at least one of the first hole injection transport layer HITL1, the first electron transport layer (ETL) ETL1, the first electron injection layer (EIL) EIL1, the second hole injection transport layer HITL2, the second electron transport layer (ETL) ETL2, or the second electron injection layer (EIL) EIL2, or may include the same material as at least one of the hole transport layer HTL or the hole injection layer HIL. The light emitting assistance layer R' is a layer having a thickness in consideration of a microcavity structure formed between the first electrode 410 of the light reflective layer and the second electrode 430 of the light semi-transmissive layer, and the first pixel Px1 emits the red light because of the light emitting assistance layer R', from among the red light generated by the first emission layer EML1_R and the blue light generated by the second emission layer EML2_B. In detail, if the holes and the electrons are respectively injected from the first electrode 410 and the second electrode 430 to the first emission layer EML1_R for emitting the red light and the second emission layer EML2_B for emitting the blue light, the first emission layer EML1_R and the second emission layer EML2_B emit the red light and the blue light in the direction of the first electrode 410 and the second electrode 430 direction, and at this time, a portion of the red light and the blue light radiated from the first emission layer EML1_R and the second emission layer EML2_B to the second electrode 430 is reflected by the second electrode 430 and the remaining non-reflected portion is transmitted through the second electrode 430. Also, a portion of the red light and the blue light radiated from the first emission layer EML1_R and the second emission layer EML2_B towards the first electrode 410, or reflected by the second electrode 430 and radiated towards the first electrode 410, is reflected by the first electrode 410, and thereby a portion is again radiated in the direction of the second electrode 430.

As described above, the microcavity structure is formed between the first electrode 410 and the second electrode 430, and at this time, the color of the light visible outside through the second electrode 430 is determined according to the thickness of the organic emission layer 420 positioned between the first electrode 410 and the second electrode 430. In the microcavity structure, the thickness of the organic emission layer 420 may be sequentially thicker in the sequence of the blue light, the green light, and the red light according to the wavelength of the light, and the light emitting assistance layer R' is positioned in the first pixel Px1 such that the thickness of the organic emission layer 420 of the first pixel Px1 is formed with the microcavity structure such that the light emitted from the first emission layer EML1_R is visible outside. That is, the entire thickness of the organic emission layer 420 of the first pixel Px1 is determined as the thickness such that the red light is visible outside because of the microcavity structure including the light emitting assistance layer R' positioned on the first pixel Px1 such that the red light as the light emitted from the first emission layer EML1_R is emitted by the first pixel Px1. Furthermore, the microcavity effect according to the microcavity structure is added to the red light emitted from the first pixel Px1 of the first emission layer EML1_R such that light efficiency and color reproducibility of the red light emitted from the first pixel Px1 may be improved.

Also, the light emitting assistance layer R' is selectively positioned only in the first pixel Px1 from among the first pixel Px1, the second pixel Px2, and the third pixel Px3, such that the light emitting assistance layer R' is not positioned in the second pixel Px2 of the second region neighboring the first pixel Px1, which corresponds to the first region. As described above, the second pixel Px2 does not include the light emitting assistance layer R' such that the thickness of the organic emission layer 420 of the second pixel Px2 is formed with the microcavity structure so that the blue light emitted from the second emission layer EML2_B is visible outside. That is, since the light emitting assistance layer R' is not included in the second pixel Px2, the entire thickness of the organic emission layer 420 of the second pixel Px2 is formed with the thickness so that the blue light is emitted to the outside, and thereby the blue light emitted from the second emission layer EML2_B is emitted by the second pixel Px2. Furthermore, the microcavity effect according to the microcavity structure is added to the blue light emitted from the second emission layer EML2_B of the second pixel Px2 such that the light efficiency and the color reproducibility of the blue light emitted from the second pixel Px2 may be improved.

Further, the color transformation matrix 600 is selectively formed on the second electrode 430 only in the third pixel Px3 from, among the first pixel Px1, the second pixel Px2, and the third pixel Px3. As described above, the color transformation matrix 600 is positioned at the third pixel Px3 of the third region neighboring the second pixel Px2 of the second region such that the wavelength of the light emitted from the first emission layer EML1_R and the second emission layer EML2_B and passing through the second electrode 430 is converted. In the organic light emitting diode (OLED) display 1001 according to the first exemplary embodiment, the color transformation matrix 600 converts the light emitted from the first emission layer EML1_R and the second emission layer EML2_B into green light. That is, the color transformation matrix 600 for converting received light into green light is positioned at the third pixel Px3 such that the green light is emitted by the third pixel Px3.

As described above, the organic light emitting diode (OLED) display 1001 according to the first exemplary embodiment includes only the first emission layer EML1_R and the second emission layer EML2_B in contrast to a conventional organic light emitting element that includes the organic emission layer 420 of the organic light emitting element 400 deposited with three emission layers to emit white light. Therefore, according to the first exemplary embodiment, an entire thickness of the organic emission layer 420 may be decreased by using the microcavity structure, and thereby the manufacturing cost and the manufacturing time of the organic light emitting diode (OLED) display 1001 may be reduced.

Also, the organic light emitting diode (OLED) display 1001 according to the first exemplary embodiment has a similar thickness of the organic emission layer 420 to the thickness of a structure in which only one emission layer is deposited such that the driving voltage may be reduced by two times to five times compared with the conventional organic light emitting element deposited with three emission layers to emit the white light, thereby reducing the power consumption for driving the organic light emitting diode (OLED) display 1001. Accordingly, the driving efficiency of the organic light emitting diode (OLED) display 1001 may be improved.

Also, the organic light emitting diode (OLED) display 1001 according to the first exemplary embodiment includes the organic emission layer 420 deposited with a plurality of emission layers using a microcavity structure unlike the conventional organic light emitting diode (OLED) display in which emission layers emitting each of red, green, and blue light are deposited for each pixel for forming a plurality of pixels. This way, the number of masks used when depositing the emission layers is reduced, and thereby the manufacturing cost and the manufacturing time of the organic light emitting diode (OLED) display 1001 may be reduced. Also, by reducing the number of masks to manufacture the organic light emitting diode (OLED) display 1001, deterioration of pixel driving due to a shadowing phenomenon according to the usage of the mask is reduced or minimized, and thereby generation of a dark point (or a dark spot) in the pixel of the organic light emitting diode (OLED) display 1001 may be reduced or minimized.

Also, the organic light emitting diode (OLED) display 1001 according to the first exemplary embodiment is formed with the microcavity structure at the organic emission layer 420 such that the light efficiency and the color reproducibility of the red light, the blue light, and the green light emitted in the first pixel Px1, the second pixel Px2, and the third pixel Px3 may be improved.

Also, the organic light emitting diode (OLED) display 1001 according to the first exemplary embodiment realizes the green light by the color transformation matrix 600 such that it is not necessary for the organic emission layer 420 to include the emission layer emitting the green light, and thereby the manufacturing cost and the manufacturing time of the organic light emitting diode (OLED) display 1001 may be reduced.

Next, referring to FIG. 5 to FIG. 8, organic light emitting diode (OLED) displays according to a second exemplary embodiment to a fifth exemplary embodiment will be described.

Distinctive features differing from the first exemplary embodiment will be described, and the omitted description follows that of the first exemplary embodiment. The second exemplary embodiment to the fifth exemplary embodiment have the same reference numerals for the same constituent elements as the first exemplary embodiment for better comprehension and ease of description.

Figure 5:
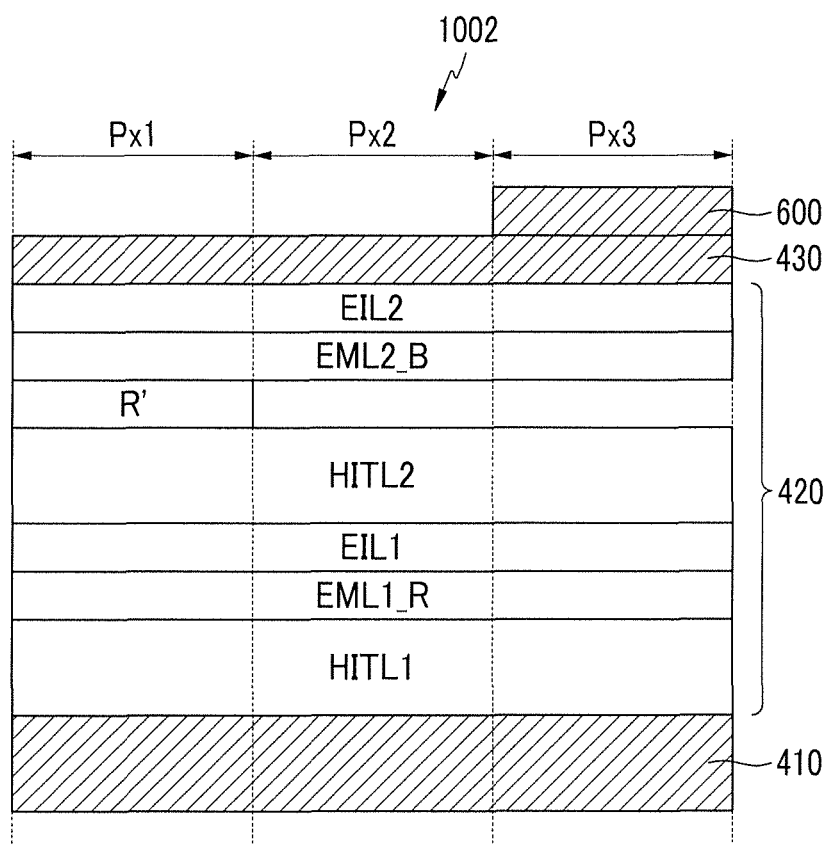
FIG. 5 is a schematic cross-sectional view of elements of an organic light emitting diode (OLED) display according to a second exemplary embodiment.

FIG. 5 is a schematic cross-sectional view of components (or elements) of an organic light emitting diode (OLED) display according to the second exemplary embodiment.

As shown in FIG. 5, each organic emission layer 420 of the first pixel Px1, the second pixel Px2, and the third pixel Px3 of the organic light emitting diode (OLED) display 1002 according to the second exemplary embodiment commonly includes the first hole injection transport layer HITL1, the first emission layer EML1_R, the first electron injection layer (EIL) EIL1, the second hole injection transport layer HITL2, the second emission layer EML2_B, and the second electron injection layer (EIL) EIL2. The organic emission layer 420 of the first pixel Px1 from among the first pixel Px1, the second pixel Px2, and the third pixel Px3, further includes the light emitting assistance layer R', and the color transformation matrix 600 is positioned in the third pixel Px3.

The second emission layer EML2_B has better (or higher) electron transferring capability in comparison to the first emission layer EML1_R. As described above, by increasing (or improving) the electron transferring capability of the second emission layer EML2_B, the first electron transport layer (ETL) ETL1 and the second electron transport layer (ETL) ETL2 described for the organic light emitting diode (OLED) display 1001 according to the first exemplary embodiment may be omitted.

As described above, in the organic light emitting diode (OLED) display 1002 according to the second exemplary embodiment, the second emission layer EML2_B has increased or improved electron transferring capability in comparison to the first emission layer EML1_R, such that the entire thickness of the organic emission layer 420 is decreased, and thereby the manufacturing cost and the manufacturing time of the organic light emitting element 400 may be reduced, and concurrently (e.g., simultaneously) the power consumption to drive the organic light emitting diode (OLED) display 1002 may be reduced, and resultantly the driving efficiency of the organic light emitting diode (OLED) display 1002 may be improved.

Figure 6:
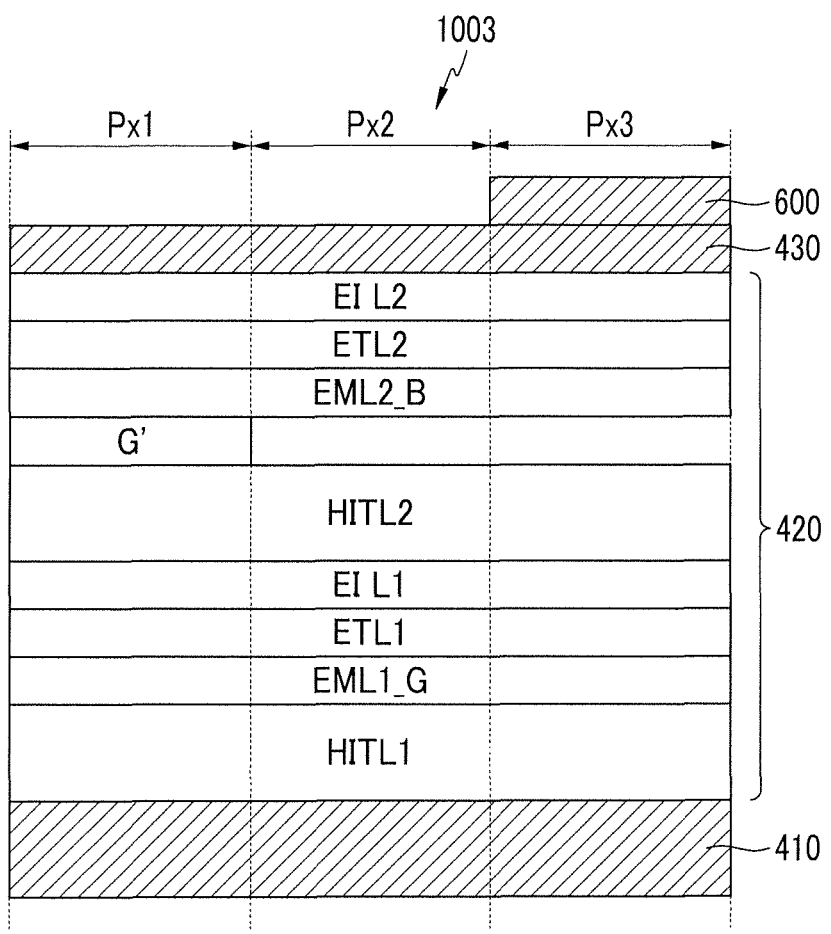
FIG. 6 is a schematic cross-sectional view of elements of an organic light emitting diode (OLED) display according to a third exemplary embodiment.

FIG. 6 is a schematic cross-sectional view of components (or elements) of an organic light emitting diode (OLED) display according to the third exemplary embodiment.

As shown in FIG. 6, each organic emission layer 420 of the first pixel Px1, the second pixel Px2, and the third pixel Px3 of the organic light emitting diode (OLED) display 1003 according to the third exemplary embodiment commonly includes the first hole injection transport layer HITL1, the first emission layer EML1_G, the first electron transport layer (ETL) ETL1, the first electron injection layer (EIL) EIL1, the second hole injection transport layer HITL2, the second emission layer EML2_B, the second electron transport layer (ETL) ETL2, and the second electron injection layer (EIL) EIL2. The organic emission layer 420 of the first pixel Px1 from among the first pixel Px1, the second pixel Px2, and the third pixel Px3, further includes a light emitting assistance layer G', and a color transformation matrix 600 is positioned in the third pixel Px3.

The first emission layer EML1_G is positioned between the first hole injection transport layer HITL1 and the first electron transport layer (ETL) ETL1, and holes generated from the first electrode 410 and electrons generated from the second electrode 430 are combined, thereby emitting green light.

The second emission layer EML2_B is positioned between the second hole injection transport layer HITL2 and the second electron transport layer (ETL) ETL2, and holes generated from the first electrode 410 and electrons generated from the second electrode 430 are combined, thereby emitting blue light.

The light emitting assistance layer G' is positioned only in the first pixel Px1 corresponding to the first region, thereby having a function of increasing the thickness of the organic emission layer 420 of the first pixel Px1. The light emitting assistance layer G' is the layer having a thickness in consideration of a microcavity structure formed between the light reflective first electrode 410 and the light semi-transmissive second electrode 430, and thereby the first pixel Px1 emits green light because of the light emitting assistance layer G', from among the green light generated by the first emission layer EML1_G and the blue light generated by the second emission layer EML2_B. For example, if the holes and the electrons are respectively injected to the first emission layer EML1_G for emitting the green light and the second emission layer EML2_B for emitting the blue light from the first electrode 410 and the second electrode 430, the first emission layer EML1_G and the second emission layer EML2_B respectively emit the green light and the blue light in the direction of the first electrode 410 and the second electrode 430, and at this time, a portion of the green light and the blue light respectively radiated from the first emission layer EML1_G and the second emission layer EML2_B towards the second electrode 430 is reflected by the second electrode 430 and the remaining non-reflected portion is transmitted through the second electrode 430. Also, a portion of the green light and the blue light that are respectively radiated from the first emission layer EML1_G and the second emission layer EML2_B to the first electrode 410, or are reflected by the second electrode 430 and are radiated towards the first electrode 410, is reflected by the first electrode 410, and then is again radiated towards the second electrode 430.

As described above, the microcavity structure is formed between the first electrode 410 and the second electrode 430, and at this time, the color of the light that is visible outside through the second electrode 430 is determined according to the thickness of the organic emission layer 420 positioned between the first electrode 410 and the second electrode 430. In the microcavity structure, the thickness of the organic emission layer 420 may be sequentially increased in the sequence of the blue light, the green light, and the red light according to the wavelength of light, and the light emitting assistance layer G' is positioned in the first pixel Px1 such that the thickness of the organic emission layer 420 of the first pixel Px1 is formed with the microcavity structure so that the green light emitted in the first emission layer EML1_G is visible outside. That is, the entire thickness of the organic emission layer 420 of the first pixel Px1 is determined as the thickness so that the green light is visible outside because of the light emitting assistance layer G' positioned in the first pixel Px1 in consideration of the microcavity structure such that the green light emitted from the first emission layer EML1_G is emitted by the first pixel Px1. Furthermore, the microcavity effect according to the microcavity structure is added to the green light emitted from the first emission layer EML1_G of the first pixel Px1 such that the light efficiency and the color reproducibility of the green light emitted from the first pixel Px1 may be improved.

Also, the light emitting assistance layer G' is selectively formed in the first pixel Px1 from among the first pixel Px1, the second pixel Px2, and the third pixel Px3 such that the light emitting assistance layer G' is not positioned in the second pixel Px2 of the second region neighboring the first pixel Px1 of the first region. As described above, the light emitting assistance layer G' is not positioned in the second pixel Px2 such that the thickness of the organic emission layer 420 of the second pixel Px2 is formed with the microcavity structure so that the blue light emitted from the second emission layer EML2_B is visible outside. That is, the second pixel Px2 does not include the light emitting assistance layer G' such that the entire thickness of the organic emission layer 420 of the second pixel Px2 is determined as the thickness so that the blue light is visible outside, and thereby the blue light emitted from the second emission layer EML2_B is recognized in the second pixel Px2. Furthermore, the microcavity effect according to the microcavity structure is added to the blue light emitted from the second emission layer EML2_B of the second pixel Px2 such that the light efficiency and the color reproducibility of the blue light emitted from the second pixel Px2 may be improved.

Further, the color transformation matrix 600 is selectively formed on the second electrode 430 in the third pixel Px3 only, from among the first pixel Px1, the second pixel Px2, and the third pixel Px3. As described above, the color transformation matrix 600 is positioned at the third pixel Px3 of the third region neighboring the second pixel Px2 of the second region such that the wavelength of the light emitted from the first emission layer EML1_R and the second emission layer EML2_B and passing through the second electrode 430 is converted. In the organic light emitting diode (OLED) display 1003 according to the third exemplary embodiment, the color transformation matrix 600 converts the light emitted from the first emission layer EML1_G and the second emission layer EML2_B into red light. That is, the color transformation matrix 600 for converting light into red light is positioned at the third pixel Px3 such that the red light is emitted by the third pixel Px3.

As described above, the organic light emitting diode (OLED) display 1003 according to the third exemplary embodiment only includes the first emission layer EML1_G and the second emission layer EML2_B in contrast to a conventional organic light emitting element including the organic emission layer 420 of the organic light emitting element 400 deposited with three emission layers to emit white light such that the entire thickness of the organic emission layer 420 is decreased by using the microcavity structure, and thereby the manufacturing cost and the manufacturing time of the organic light emitting diode (OLED) display 1003 may be reduced.

Also, the organic light emitting diode (OLED) display 1003 according to the third exemplary embodiment has a similar thickness of the organic emission layer 420 as the thickness of the structure in which only one emission layer is deposited such that the driving voltage may be reduced by two times to five times compared with the conventional organic light emitting element deposited with three emission layers to emit white light, thereby reducing the power consumed to drive the organic light emitting diode (OLED) display 1003. Accordingly, the driving efficiency of the organic light emitting diode (OLED) display 1003 may be improved.

Also, the organic light emitting diode (OLED) display 1003 according to the third exemplary embodiment includes the organic emission layer 420 deposited with a plurality of emission layers using a microcavity structure unlike the conventional organic light emitting diode (OLED) display in which the emission layers emitting each of red, green, and blue light are deposited for each pixel for forming a plurality of pixels. This way, the number of masks used when depositing the emission layers is reduced, and thereby the manufacturing cost and the manufacturing time of the organic light emitting diode (OLED) display 1003 may be reduced. Also, by reducing the number of masks used to manufacture the organic light emitting diode (OLED) display 1003, pixel driving deterioration due to a shadowing phenomenon according to the usage of the mask is reduced or minimized, and thereby generation of a dark point (or dark spot) in the pixel of the organic light emitting diode (OLED) display 1003 may be reduced or minimized.

Also, the organic light emitting diode (OLED) display 1003 according to the third exemplary embodiment is formed with the microcavity structure at the organic emission layer 420 such that the light efficiency and the color reproducibility of the red light, the blue light, and the green light emitted in the first pixel Px1, the second pixel Px2, and the third pixel Px3, may be improved.

Also, the organic light emitting diode (OLED) display 1003 according to the third exemplary embodiment realizes the red light by the color transformation matrix 600 such that it is not necessary for the organic emission layer 420 to include the emission layer for emitting red light, and thereby the manufacturing cost and the manufacturing time of the organic light emitting diode (OLED) display 1003 may be reduced.

Figure 7:
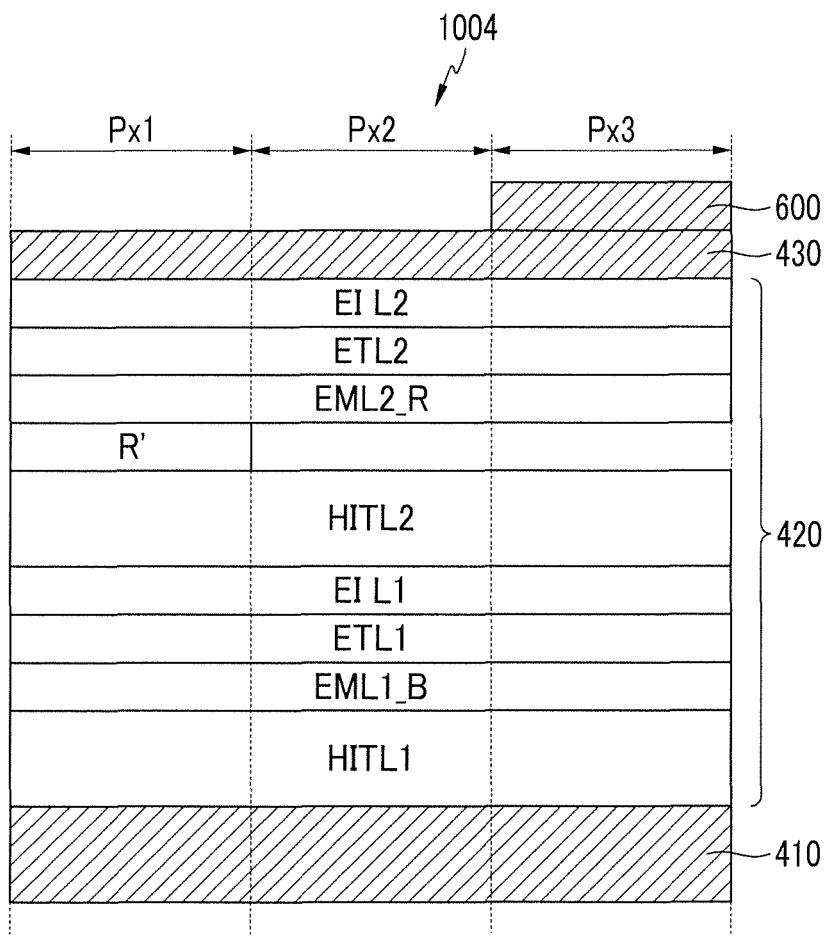
FIG. 7 is a schematic cross-sectional view of elements of an organic light emitting diode (OLED) display according to a fourth exemplary embodiment.

FIG. 7 is a schematic cross-sectional view of components (or elements) of an organic light emitting diode (OLED) display according to the fourth exemplary embodiment.

As shown in FIG. 7, each organic emission layer 420 of the first pixel Px1, the second pixel Px2, and the third pixel Px3 of the organic light emitting diode (OLED) display 1004 according to the fourth exemplary embodiment commonly includes the first hole injection transport layer HITL1, the first emission layer EML1_B, the first electron transport layer (ETL) ETL1, the first electron injection layer (EIL) EIL1, the second hole injection transport layer HITL2, the second emission layer EML2_R, the second electron transport layer (ETL) ETL2, and the second electron injection layer (EIL) EIL2. The organic emission layer 420 of the first pixel Px1 from among the first pixel Px1, the second pixel Px2, and the third pixel Px3, further includes the light emitting assistance layer R', and the color transformation matrix 600 is positioned in the third pixel Px3.

The first emission layer EML1_B is positioned between the first hole injection transport layer HITL1 and the first electron transport layer (ETL) ETL1, and holes generated from the first electrode 410 and electrons generated from the second electrode 430 are combined, thereby emitting blue light.

The second emission layer EML2_R is positioned between the second hole injection transport layer HITL2 and the second electron transport layer (ETL) ETL2, and the holes generated from the first electrode 410 and the electrons generated from the second electrode 430 are combined, thereby emitting red light.

The light emitting assistance layer R' is positioned only in the first pixel Px1 of the first region, thereby increasing the thickness of the organic emission layer 420 of the first pixel Px1. The light emitting assistance layer R' is the layer having a thickness in consideration of a microcavity structure formed between the light reflective first electrode 410 and the light semi-transmissive second electrode 430, and thereby the first pixel Px1 emits red light because of the light emitting assistance layer R', from among the blue light generated by the first emission layer EML1_B and the red light generated by the second emission layer EML2_R. In detail, if the holes and the electrons are respectively injected to the first emission layer EML1_B for emitting blue light and the second emission layer EML2_R for emitting red light from the first electrode 410 and the second electrode 430, the first emission layer EML1_B and the second emission layer EML2_R respectively emit blue light and red light in the direction of the first electrode 410 and the second electrode 430, and a portion of the blue light and the red light respectively radiated from the first emission layer EML1_B and the second emission layer EML2_R to the second electrode 430 is reflected by the second electrode 430 and the remaining portion is transmitted through the second electrode 430. Also, the portion of the blue light and the red light that are respectively radiated from the first emission layer EML1_B and the second emission layer EML2_R to the first electrode 410, or are reflected by the second electrode 430 and are radiated towards the first electrode 410, is reflected by the first electrode 410, and then is again radiated in the direction of the second electrode 430.

As described above, the microcavity structure is formed between the first electrode 410 and the second electrode 430, at this time, the color of the light that is visible outside through the second electrode 430 is determined according to the thickness of the organic emission layer 420 positioned between the first electrode 410 and the second electrode 430. In the microcavity structure, the thickness of the organic emission layer 420 may be sequentially increased in the sequence of the blue light, the green light, and the red light according to the wavelength of the light, and the light emitting assistance layer R' is positioned in the first pixel Px1 such that the thickness of the organic emission layer 420 of the first pixel Px1 is formed with the microcavity structure so that the red light emitted in the second emission layer EML2_R is visible outside. That is, the entire thickness of the organic emission layer 420 of the first pixel Px1 is determined as the thickness so that the red light is visible outside because of the light emitting assistance layer R' positioned in the first pixel Px1 in consideration of the microcavity structure such that the red light emitted from the second emission layer EML2_R is visible in the first pixel Px1. Furthermore, the microcavity effect according to the microcavity structure is added to the red light emitted from the second emission layer EML2_R of the first pixel Px1 such that the light efficiency and the color reproducibility of the red light emitted from the first pixel Px1 may be improved.

Also, the light emitting assistance layer R' is selectively formed in the first pixel Px1 from among the first pixel Px1, the second pixel Px2, and the third pixel Px3 such that the light emitting assistance layer R' is not positioned in the second pixel Px2 of the second region neighboring the first pixel Px1 of the first region. As described above, the light emitting assistance layer R' is not positioned in the second pixel Px2 such that the thickness of the organic emission layer 420 of the second pixel Px2 is formed with the microcavity structure so that the blue light emitted from the first emission layer EML1_B is visible outside. That is, the second pixel Px2 does not include the light emitting assistance layer R' such that the entire thickness of the organic emission layer 420 of the second pixel Px2 is determined as the thickness so that the blue light is emitted to outside, and thereby the blue light emitted from the first emission layer EML1_B is emitted by the second pixel Px2. Furthermore, the microcavity effect according to the microcavity structure is added to the blue light emitted from the first emission layer EML1_B of the second pixel Px2 such that the light efficiency and the color reproducibility of the blue light emitted from the second pixel Px2 may be improved.

Further, the color transformation matrix 600 is selectively formed on the second electrode 430 in the third pixel Px3 only, from among the first pixel Px1, the second pixel Px2, and the third pixel Px3. As described above, the color transformation matrix 600 is positioned at the third pixel Px3 of the third region neighboring the second pixel Px2 of the second region such that the wavelength of the light emitted from the first emission layer EML1_B and the second emission layer EML2_R and passing through the second electrode 430 is converted. In the organic light emitting diode (OLED) display 1004 according to the fourth exemplary embodiment, the color transformation matrix 600 converts the light emitted from the first emission layer EML1_B and the second emission layer EML2_R into green light. That is, the color transformation matrix 600 that converts light into green light is positioned at the third pixel Px3 such that green light is emitted by the third pixel Px3.

As described above, the organic light emitting diode (OLED) display 1004 according to the fourth exemplary embodiment includes only the first emission layer EML1_B and the second emission layer EML2_R in contrast to the conventional organic light emitting element including the organic emission layer 420 of the organic light emitting element 400 deposited with three emission layers to emit white light such that the entire thickness of the organic emission layer 420 is decreased by using the microcavity structure, and thereby the manufacturing cost and the manufacturing time of the organic light emitting diode (OLED) display 1003 may be reduced.

Also, the organic light emitting diode (OLED) display 1004 according to the fourth exemplary embodiment has a similar thickness of the organic emission layer 420 as the thickness of the structure in which only one emission layer is deposited such that the driving voltage may be reduced by two times to five times compared with the conventional organic light emitting element deposited with three emission layers to emit the white light, thereby reducing the power consumption for driving the organic light emitting diode (OLED) display 1004. Accordingly, the driving efficiency of the organic light emitting diode (OLED) display 1004 may be improved.

Further, the organic light emitting diode (OLED) display 1004 according to the fourth exemplary embodiment includes the organic emission layer 420 deposited with a plurality of emission layers using a microcavity structure unlike the conventional organic light emitting diode (OLED) display in which the emission layers emitting each of red, green, and blue light are deposited for each pixel for forming a plurality of pixels. This way, the number of masks used when depositing the emission layer is reduced, and thereby the manufacturing cost and the manufacturing time of the organic light emitting diode (OLED) display 1004 may be reduced. Also, by reducing the number of masks to manufacture the organic light emitting diode (OLED) display 1004, pixel driving deterioration due to a shadowing phenomenon according to the usage of the mask is reduced or minimized, and thereby generation of a dark point (or a dark spot) in the pixel of the organic light emitting diode (OLED) display 1004 may be reduced or minimized.

Also, the organic light emitting diode (OLED) display 1004 according to the fourth exemplary embodiment is formed with the microcavity structure for the organic emission layer 420 such that the light efficiency and the color reproducibility of the red light, the blue light, and the green light emitted in the first pixel Px1, the second pixel Px2, and the third pixel Px3 may be improved.

Also, the organic light emitting diode (OLED) display 1004 according to the fourth exemplary embodiment realizes green light by the color transformation matrix 600 such that it is not necessary for the organic emission layer 420 to include the emission layer emitting green light, and thereby the manufacturing cost and the manufacturing time of the organic light emitting diode (OLED) display 1004 may be reduced.

Figure 8:
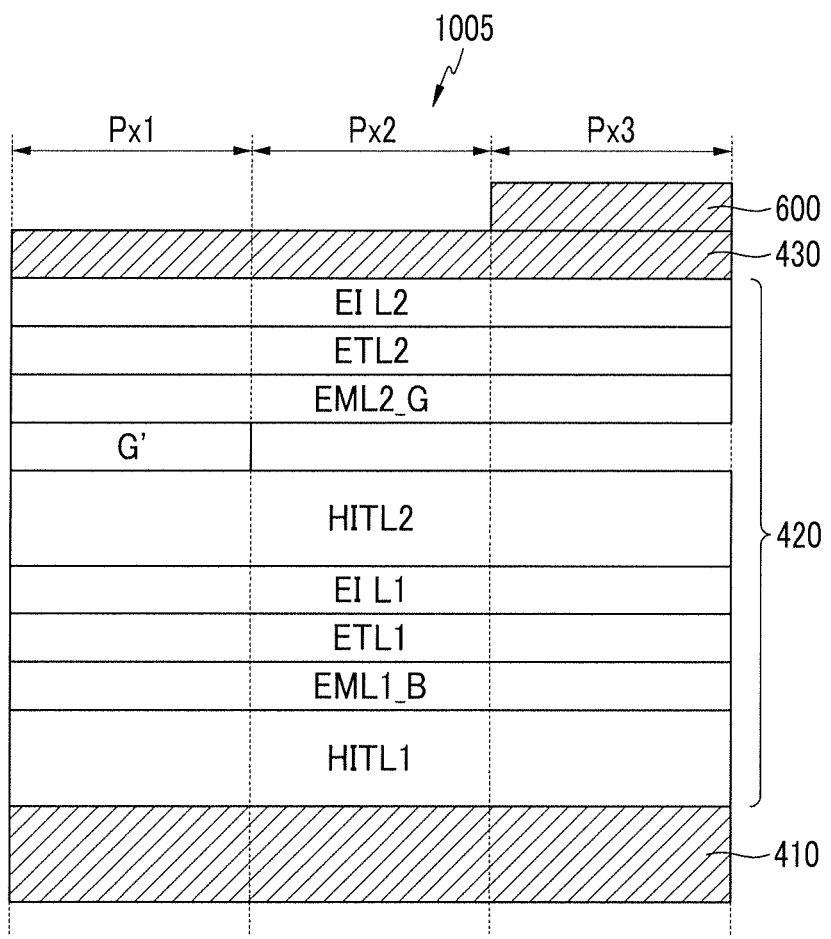
FIG. 8 is a schematic cross-sectional view of elements of an organic light emitting diode (OLED) display according to a fifth exemplary embodiment.

FIG. 8 is a schematic cross-sectional view of components (or elements) of an organic light emitting diode (OLED) display according to the fifth exemplary embodiment.

As shown in FIG. 8, each organic emission layer 420 of the first pixel Px1, the second pixel Px2, and the third pixel Px3 of the organic light emitting diode (OLED) display 1004 according to the fifth exemplary embodiment commonly includes the first hole injection transport layer HITL1, the first emission layer EML1_B, the first electron transport layer (ETL) ETL1, the first electron injection layer (EIL) EIL1, the second hole injection transport layer HITL2, the second emission layer EML2_G, the second electron transport layer (ETL) ETL2, and the second electron injection layer (EIL) EIL2. The organic emission layer 420 of the first pixel Px1 among the first pixel Px1, the second pixel Px2, and the third pixel Px3, further includes the light emitting assistance layer G', and the third pixel Px3 includes the color transformation matrix 600.

The first emission layer EML1_B is positioned between the first hole injection transport layer HITL1 and the first electron transport layer (ETL) ETL1, and the holes generated from the first electrode 410 and the electrons generated from the second electrode 430 are combined, thereby emitting blue light.

The second emission layer EML2_G is positioned between the second hole injection transport layer HITL2 and the second electron transport layer (ETL) ETL2, and the holes generated from the first electrode 410 and the electrons generated from the second electrode 430 are combined, thereby emitting green light.

The light emitting assistance layer G' is only positioned in the first pixel Px1 of the first region, thereby increasing the thickness of the organic emission layer 420 of the first pixel Px1. The light emitting assistance layer G' is the layer having a thickness in consideration of the microcavity structure formed between the light reflective first electrode 410 and the light semi-transmissive second electrode 430, and thereby the first pixel Px1 emits green light because of the light emitting assistance layer G', from among the blue light generated by the first emission layer EML1_B and the green light generated by the second emission layer EML2_G. In detail, if the holes and the electrons are respectively injected to the first emission layer EML1_B for emitting the blue light and the second emission layer EML2_G for emitting the green light from the first electrode 410 and the second electrode 430, the first emission layer EML1_B and the second emission layer EML2_G respectively emit blue light and green light in the direction of the first electrode 410 and the second electrode 430, and the portion of the blue light and the green light respectively radiated from the first emission layer EML1_B and the second emission layer EML2_G to the second electrode 430 is reflected by the second electrode 430 and the remaining portion is transmitted through the second electrode 430. Also, the portion of the blue light and the green light that are respectively radiated from the first emission layer EML1_B and the second emission layer EML2_G towards the first electrode 410, or are reflected by the second electrode 430 and are radiated towards the first electrode 410, is reflected by the first electrode 410, and then is again radiated in the direction of the second electrode 430.

As described above, the microcavity structure is formed between the first electrode 410 and the second electrode 430, and the color of the light that is visible outside through the second electrode 430 is determined according to the thickness of the organic emission layer 420 positioned between the first electrode 410 and the second electrode 430. In the microcavity structure, the thickness of the organic emission layer 420 may be sequentially increased in the sequence of the blue light, the green light, and the red light according to the wavelength of the light, and the light emitting assistance layer G' is positioned in the first pixel Px1 such that the thickness of the organic emission layer 420 of the first pixel Px1 is formed with the microcavity structure so that the red light emitted in the second emission layer EML2_G is recognized outside. That is, the entire thickness of the organic emission layer 420 of the first pixel Px1 is determined as the thickness so that green light is visible outside because of the light emitting assistance layer G' positioned in the first pixel Px1 in consideration of the microcavity structure such that the green light emitted from the second emission layer EML2_G is emitted by the first pixel Px1. Furthermore, the microcavity effect according to the microcavity structure is added to the green light emitted from the second emission layer EML2_G of the first pixel Px1 such that the light efficiency and the color reproducibility of the green light emitted from the first pixel Px1 may be improved.

Also, the light emitting assistance layer G' is selectively formed in the first pixel Px1 from among the first pixel Px1, the second pixel Px2, and the third pixel Px3, such that the light emitting assistance layer G' is not positioned in the second pixel Px2 of the second region neighboring the first pixel Px1 of the first region. As described above, the light emitting assistance layer G' is not positioned in the second pixel Px2 such that the thickness of the organic emission layer 420 of the second pixel Px2 is formed with the microcavity structure so that the blue light emitted from the first emission layer EML1_B is recognized outside. That is, the second pixel Px2 does not include the light emitting assistance layer G' such that the entire thickness of the organic emission layer 420 of the second pixel Px2 is determined as the thickness so that blue light is visible outside, and thereby the blue light emitted from the first emission layer EML1_B is emitted by the second pixel Px2. Furthermore, the microcavity effect according to the microcavity structure is added to the blue light emitted from the first emission layer EML1_B of the second pixel Px2 such that the light efficiency and the color reproducibility of the blue light emitted from the second pixel Px2 may be improved.

Further, the color transformation matrix 600 is selectively formed on the second electrode 430 in the third pixel Px3 only, from among the first pixel Px1, the second pixel Px2, and the third pixel Px3. As described above, the color transformation matrix 600 is positioned at the third pixel Px3 of the third region neighboring the second pixel Px2 of the second region such that the wavelength of the light emitted from the first emission layer EML1_B and the second emission layer EML2_G and passing through the second electrode 430 is converted. In the organic light emitting diode (OLED) display 1005 according to the fifth exemplary embodiment, the color transformation matrix 600 converts the light emitted from the first emission layer EML1_B and the second emission layer EML2_G into red light. That is, the color transformation matrix 600 that converts light into red light is positioned at the third pixel Px3 such that red light is emitted by the third pixel Px3.

As described above, the organic light emitting diode (OLED) display 1005 according to the fifth exemplary embodiment includes only the first emission layer EML1_B and the second emission layer EML2_G in contrast to the conventional organic light emitting element including the organic emission layer 420 of the organic light emitting element 400 deposited with three emission layers to emit white light such that the entire thickness of the organic emission layer 420 is decreased by using the microcavity structure, and thereby the manufacturing cost and the manufacturing time of the organic light emitting diode (OLED) display 1005 may be reduced.

Also, the organic light emitting diode (OLED) display 1005 according to the fifth exemplary embodiment has a similar thickness of the organic emission layer 420 to the thickness of the structure in which only one emission layer is deposited such that the driving voltage may be reduced by two times to five times compared with the conventional organic light emitting element deposited with three emission layers to emit white light, thereby reducing the power consumption for driving the organic light emitting diode (OLED) display 1005. Accordingly, the driving efficiency of the organic light emitting diode (OLED) display 1005 may be improved.

Also, the organic light emitting diode (OLED) display 1005 according to the fifth exemplary embodiment includes the organic emission layer 420 deposited with a plurality of emission layers using a microcavity structure unlike the conventional organic light emitting diode (OLED) display in which the emission layers emitting each of red, green, and blue light are deposited for each pixel for forming a plurality of pixels. This way, the number of masks used when depositing the emission layer is reduced, and thereby the manufacturing cost and the manufacturing time of the organic light emitting diode (OLED) display 1005 may be reduced. Further, by reducing the number of masks to manufacture the organic light emitting diode (OLED) display 1005, pixel driving deterioration due to a shadowing phenomenon according to the usage of the mask is reduced or minimized, and thereby generation of a dark point in the pixel of the organic light emitting diode (OLED) display 1005 may be reduced or minimized.

In addition, the organic light emitting diode (OLED) display 1005 according to the fifth exemplary embodiment is formed with the microcavity structure at the organic emission layer 420 such that the light efficiency and the color reproducibility of the red light, the blue light, and the green light emitted in the first pixel Px1, the second pixel Px2, and the third pixel Px3 may be improved.

Also, the organic light emitting diode (OLED) display 1005 according to the fifth exemplary embodiment realizes red light by the color transformation matrix 600 such that it is not necessary for the organic emission layer 420 to include the emission layer emitting red light, and thereby the manufacturing cost and the manufacturing time of the organic light emitting diode (OLED) display 1005 may be reduced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

DESCRIPTION OF SOME REFERENCE CHARACTERS first electrode 410, first emission layer EML1_R, second emission layer EML2_B, second electrode 430, light emitting assistance layer R'

What is claimed is:

1. An organic light emitting diode (OLED) display comprising:
a substrate;
a first electrode on the substrate;
a first emission layer on the first electrode;
a second emission layer on the first emission layer;
a second electrode on the second emission layer;
a light emitting assistance layer positioned between the first emission layer and the second emission layer only at a first pixel region and the light emitting assistance layer not positioned between the first emission layer and the second emission layer at a second pixel region and a third pixel region different from the first pixel region; and
a color transformation matrix positioned in the third pixel region neighboring the second pixel region and configured to convert a wavelength of a light emitted from the first emission layer and the second emission layer,
wherein the color transformation matrix is only positioned in the third pixel region and not positioned in the first pixel region and the second pixel region.

2. The organic light emitting diode (OLED) display of claim 1, wherein
a color of light emitted from the first emission layer is visible in the first pixel region where the light emitting assistance layer is positioned.

3. The organic light emitting diode (OLED) display of claim 2, wherein
a color of light emitted from the second emission layer is visible in the second pixel region neighboring the first pixel region.

4. The organic light emitting diode (OLED) display of claim 1, wherein
the second emission layer is configured to emit blue light.

5. The organic light emitting diode (OLED) display of claim 4, wherein
the first emission layer is configured to emit red light.

6. The organic light emitting diode (OLED) display of claim 5, wherein
the color transformation matrix is configured to convert the light from the first emission layer and the second emission layer into green light.

7. The organic light emitting diode (OLED) display of claim 4, wherein
the first emission layer is configured to emit green light.

8. The organic light emitting diode (OLED) display of claim 7, wherein
the color transformation matrix is configured to convert the light emitted from the first emission layer and the second emission layer into red light.

9. The organic light emitting diode (OLED) display of claim 1, wherein
the first emission layer is configured to emit blue light.

10. The organic light emitting diode (OLED) display of claim 9, wherein
the second emission layer is configured to emit red light.

11. The organic light emitting diode (OLED) display of claim 9, wherein
the second emission layer is configured to emit green light.

12. The organic light emitting diode (OLED) display of claim 1, wherein
the first electrode is reflective and the second electrode is light semi-transmissive.

13. The organic light emitting diode (OLED) display of claim 1, wherein
the first electrode is an anode, the second electrode is a cathode, and the second emission layer has a higher electron transferring capability than the first emission layer.

14. The organic light emitting diode (OLED) display of claim 1, further comprising
at least one of an electron injection layer (EIL), an electron transport layer (ETL), a hole injection layer (HIL), or a hole transport layer (HTL) positioned between the first electrode and the second electrode, and
the light emitting assistance layer includes a same material as at least one of the electron injection layer (EIL), the electron transport layer (ETL), the hole injection layer (HIL), or the hole transport layer (HTL).

* * * * *